US011474283B2

(12) United States Patent
te Velthuis et al.

(10) Patent No.: US 11,474,283 B2
(45) Date of Patent: Oct. 18, 2022

(54) SUPER RESOLUTION FOR MAGNETO-OPTICAL MICROSCOPY

(71) Applicant: UCHICAGO ARGONNE, LLC, Chicago, IL (US)

(72) Inventors: Suzanne Gabriëlle Everdine te Velthuis, Naperville, IL (US); Michael Claus Siegfried Vogel, Westmont, IL (US); Axel Friedrich Hoffmann, Champaign, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 196 days.

(21) Appl. No.: 16/916,895

(22) Filed: Jun. 30, 2020

(65) Prior Publication Data

US 2021/0405086 A1 Dec. 30, 2021

(51) Int. Cl.
*G02B 3/00* (2006.01)
*G01R 33/032* (2006.01)
(Continued)

(52) U.S. Cl.
CPC ............ *G02B 3/0037* (2013.01); *B82Y 20/00* (2013.01); *G01N 21/17* (2013.01); *G01N 21/21* (2013.01);
(Continued)

(58) Field of Classification Search
CPC .. B82Y 20/00; G01R 33/032; G01R 33/0322; G01R 33/0325; G02B 3/0037;
(Continued)

(56) References Cited

U.S. PATENT DOCUMENTS 9,099,103 B1 8/2015 Krichevsky
9,110,316 B2 8/2015 Eliseev et al.
(Continued)

FOREIGN PATENT DOCUMENTS

CN 207424368 U * 5/2018
CN 108779976 A * 11/2018 ........... G01B 9/0201
(Continued)

OTHER PUBLICATIONS

Darafsheh, A. (2013). Optical Super-Resolution and Periodical Focusing Effects By Dielectric Microspheres (UMI No. 3589796)[Doctoral dissertation, University of North Carolina at Charlotte]. ProQuest Dissertations and Theses, ProQuest Dissertations Publishing, 249 pages. (Year: 2013).*

(Continued)

*Primary Examiner* — Gordon J Stock, Jr.
(74) *Attorney, Agent, or Firm* — Marshall, Gerstein & Borun LLP

(57) ABSTRACT

Sub-diffraction limited magneto-optical microscopy, such as Kerr or Faraday effect microscopy, provide many advantages to fields of science and technology for measuring, or imaging, the magnetization structures and magnetization domains of materials. Disclosed is a method and system for performing sub-diffraction limited magneto-optic microscopy. The method includes positioning a microlens or microlens layer relative to a surface of a sample to image the surface of the sample, forming a photonic nanojet to probe the surface of the sample, and receiving light reflected by the surface of the sample or transmitted through the sample at an imaging sensor. The methods and associated systems and devices enable sub-diffraction limited imaging of magnetic domains at resolutions 2 to 8 times the classical diffraction limit.

18 Claims, 12 Drawing Sheets

(51) Int. Cl.
G02B 21/00 (2006.01)
G01N 21/17 (2006.01)
G01N 21/21 (2006.01)
G02B 27/56 (2006.01)
G02B 27/58 (2006.01)
B82Y 20/00 (2011.01)
G01N 21/88 (2006.01)

(52) U.S. Cl.
CPC ....... *G01R 33/032* (2013.01); *G01R 33/0322* (2013.01); *G01R 33/0325* (2013.01); *G02B 21/0016* (2013.01); *G02B 27/56* (2013.01); *G02B 27/58* (2013.01); *G01N 2021/218* (2013.01); *G01N 2021/8848* (2013.01)

(58) Field of Classification Search
CPC .. G02B 27/56; G02B 27/58; G02B 2207/101; G02B 21/00; G02B 21/0004; G02B 21/0016; G02B 21/002; G02B 21/0032; G02B 21/0036; G02B 21/0052; G02B 21/006; G02B 21/0068; G02B 21/0092; G02B 21/06; G02B 21/33; G01N 21/17; G01N 2021/218; G01N 2021/8848
See application file for complete search history.

(56) References Cited

U.S. PATENT DOCUMENTS

| | | | | |
|---|---|---|---|---|
| 9,362,324 | B1* | 6/2016 | Astratov | H01L 27/14685 |
| 9,835,870 | B2* | 12/2017 | Astratov | G02B 5/008 |
| 10,345,093 | B2* | 7/2019 | Kassamakov | G01B 9/0209 |
| 10,386,620 | B2* | 8/2019 | Astratov | G02B 1/002 |
| 10,416,383 | B2* | 9/2019 | Goddard | G02B 27/0955 |
| 10,585,238 | B2* | 3/2020 | Astratov | G02B 6/08 |
| 10,677,992 | B2* | 6/2020 | Boriskin | G02B 27/0972 |
| 11,061,245 | B2* | 7/2021 | Boriskin | G02B 6/1225 |
| 2016/0320629 | A1* | 11/2016 | Leonberger | G02B 3/0056 |
| 2017/0307440 | A1* | 10/2017 | Urban | G02B 21/008 |
| 2020/0152682 | A1* | 5/2020 | Boriskin | H01L 27/14627 |
| 2021/0090238 | A1* | 3/2021 | Gallagher-Gruber | G02B 21/0016 |

FOREIGN PATENT DOCUMENTS

| | | | | |
|---|---|---|---|---|
| WO | WO-2016/020831 | A1 | | 2/2016 |
| WO | WO-2019002876 | A3 * | 3/2019 | G01J 3/0208 |
| WO | WO-2020069963 | A1 * | 4/2020 | |
| WO | WO-2020218973 | A1 * | 10/2020 | |

OTHER PUBLICATIONS

Johnson, Peter et al., "Super-resolved polarization-enhanced second harmonic generation for direct imaging of nanoscale changes in collagen architecture," downloaded from https://www.biorxiv.org/content/10.1101/2020.02.07.934000v1, 14 pages. (Year: 2020).*
Yan, Yinzhou et al., "Microsphere-Coupled Scanning Laser Confocal Nanoscope for Sub-Diffraction-Limited Imaging at 25 nm Lateral Resolution in the Visible Spectrum," ACS Nano, vol. 8, No. 2, pp. 1809-1816. (Year: 2014).*
Chen et al., Photonic nanojet enhancement of backscattering of light by nanoparticles: a potential novel visible-light ultramicroscopy technique, Optics Express, 12(7):1214-20 (Apr. 2004).
Dantham et al., Enhancement of Raman scattering by two orders of magnitude using photonic nanojet of a microsphere, J. Appl. Physics, 109:103103 (2011).
Huszka et al., Turning a normal microscope into a super-resolution instrument using a scanning microlens array, Sci Rep., 8(1):601 (Jan. 2018).
John et al., Magnetisation switching of FePt nanoparticle recording medium by femtosecond laser pulses, Sci. Rep., 7:4114 (2017).
Lu et al., Laser induced removal of spherical particles from silicon wafers, J. Appl. Physics, 87:1534 (2000).
Rayleigh, Investigations in optics, with special reference to the spectroscope, Philosophical Magazine and Journal of Science, Series 5, 8(49):261 (1879).
Wang et al., Optical virtual imaging at 50 nm lateral resolution with a white-light nanoscope, Nat. Commun., 2:218 (2011).

* cited by examiner 431 nm
*fi* = 0.61

354 nm
*fi* = 0.5

333 nm
*fi* = 0.47

SUPER RESOLUTION FOR MAGNETO-OPTICAL MICROSCOPY

STATEMENT REGARDING FEDERALLY SPONSORED RESEARCH OR DEVELOPMENT

This invention was made with government support under Contract No. DE-AC02-06CH11357 awarded by the United States Department of Energy to UChicago Argonne, LLC, operator of Argonne National Laboratory. The government has certain rights in the invention.

FIELD OF THE DISCLOSURE

The present disclosure relates to methods for improving the image resolution of magneto-optical microscopy measurements.

BACKGROUND

High resolution microscopy techniques and systems are implemented across various fields including medical devices, material analysis, semiconductor science and fabrication, and for monitoring cells and micro-organisms, among many other applications. The diffraction limit is a fundamental barrier in optical imaging, restricting the resolution for optical based microscopy. The diffraction limit for optical microscopy operating within the visible light spectrum, is around 200 nm in dimensions lateral to an optical axis, and 600 nm axially along the optical axis. There is much interest across a wide range of fields in being able to image objects at smaller spatial factors and higher resolutions.

Imaging systems and techniques with high lateral or spatial resolution are typically expensive and have certain restrictions such as small fields of view, sample environment, or require specially prepared sample surfaces or substrates. Scanning electron microscopy, scanning probe microscopy techniques, and many non-optical microscopy technologies utilize scanning of physical components which takes more time than single shot imaging. Further, although electron microscopes may operate at wavelengths shorter than ultraviolet and visible microscopes, they are still limited by the diffraction limit.

Optical microscopy may be used to measure the magnetic domains of materials by analyzing the light polarization. Imaging magnetic domains at the nanoscale is of utmost importance to understand the mesoscopic link between the basic physical properties of magnetic materials and their macroscopic properties. Observing and understanding magnetic domains and magnetization dynamics at the nanoscale is at the foundations of many technical applications of magnetic materials including spintronic computer logic, magnetic sensors, magnetic storage, magnetic cores of electrical machinery, and in material sciences among many other fields. Magneto-optic effects that can be utilized for magnetic imaging include the magneto-optical Kerr effect (MOKE), which is used for imaging in reflection and the magneto-optical Faraday effect, which is used for imaging in transmission. Other magneto-optical effects include the Cotton-Mouton effect and the Voigt effect. The diffraction limit has been a limiting factor for magneto-optic microscopy and the investigation and understanding of magnetic domains at nanoscale resolutions, as is required for the advancement of many applications and technologies.

SUMMARY OF THE DISCLOSURE

A microlens imaging system for performing sub-diffraction limit optical imaging includes a microlens layer having a plurality of microlenses. The plurality of microlenses are disposed adjacent to a surface of a sample and are configured to provide a photonic nanojet to the surface of the sample. The imaging system further includes an illumination source configured to provide optical radiation to the microlens layer. The optical radiation has a wavelength such that the microlens layer focuses the optical radiation to form the photonic nanojet that is provided to, and is incident on, the surface of the sample. An imaging sensor is configured to receive the optical radiation from the photonic nanojet reflected from the surface of the sample or transmitted through the sample. The imaging sensor is further configured to generate an electrical signal indicative of an image of the surface.

DETAILED DESCRIPTION

Figures 1A, 1B, 1C:
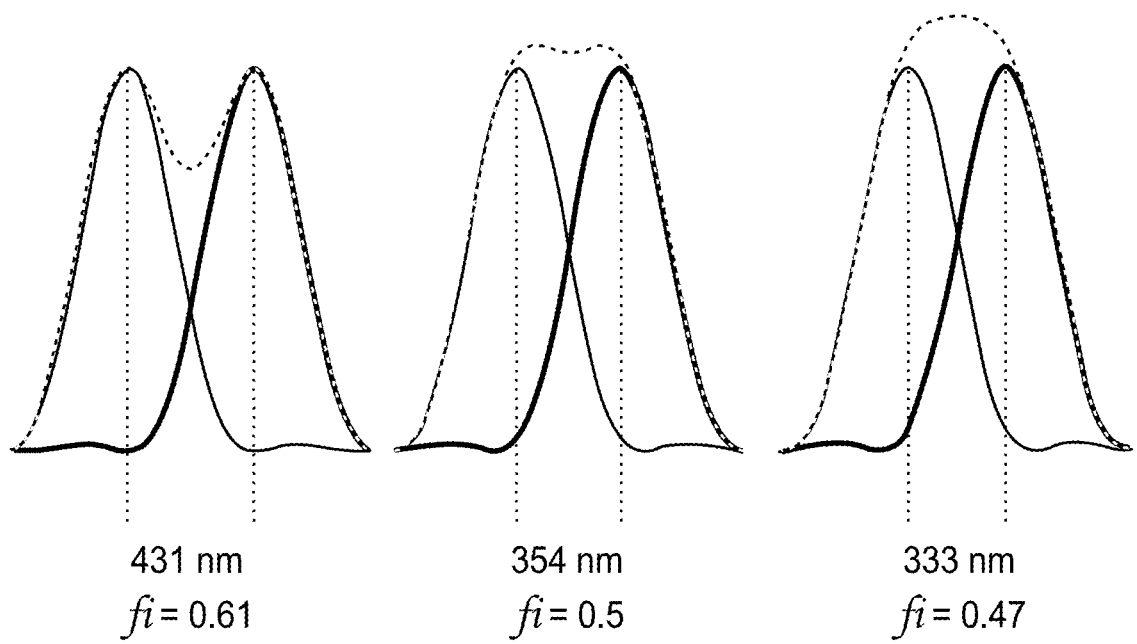
FIG. 1A is an illustration of a Rayleigh criterion diffraction limited resolution scenario.
FIG. 1B is an illustration of an Abbe criterion diffraction limited resolution scenario.
FIG. 1C is an illustration of a Sparrow criterion diffraction limited resolution scenario.

Magneto-optical microscopy, such as based on the magneto-optic Kerr effect (MOKE), is used across many fields of science and technology to measure, or image, the magnetization structures and magnetization domains of materials. Light reflected from, or transmitted through, a magnetized material may experience a change in its polarization, the intensity of its polarization, or both. The change in the polarization of the reflected light depending on the magnetization is known as the magneto-optical Kerr effect. Magneto-optic microscopy measures the changes between the polarizations of the incident light and the imaged light (either in reflection or transmission) from the magnetic materials to image magnetization at or near a surface of the magnetic materials. The incident light is polarized with a known polarization set by a polarizing filter, the light then reflects from, or transmits through, the magnetic material sample and passes through an analyzer polarizing filter, before being observed using an optical microscope. Magneto-optic microscopy may have different configurations requiring different polarizations of light. A first incident polarizer may have the option to change the polarization of the incident light (circular, linear, and elliptical) depending on specific applications and requirements. When the polarized light is reflected off the magnetic material, or transmitted through, a change in one or more of a Kerr or Faraday rotation, change in Kerr or Faraday ellipticity, or change in polarized amplitude may occur. The analyzer polarizing filter and the analyzer convert changes in polarization into changes in light intensity, which are used to generate an image. In practice, a digital camera together with a computer system is often used to create the image of the magnetization on the surface from these changes in reflected or transmitted light polarization.

The described system and methods improve the spatial resolution of images obtained with magneto-optic microscopy relative to the fundamental resolution value as dictated by the diffraction limit. The images obtained using the methods and systems described have sub-diffraction limit resolutions that allow for the imaging of smaller features and finer details than diffraction limited imaging technologies. The methods include placing a micrometer-sized lens (i.e., a microsphere, a micro sized ellipse, or an array of such objects) of a material with a specific optical index of refraction, on the surface of a magnetic sample, and focusing the magneto-optic microscope on a virtual image on a plane below the sphere, instead of on the surface of the sample. The spheres preserve the polarization of the light enabling super resolution wide-field magneto-optic microscopy measurements.

The disclosed sub-diffraction limited imaging methods and systems exhibit an increase of the spatial resolution of imaged magnetic domains by more than a factor of 2 over the diffraction limit for both longitudinal and polar Kerr or Faraday configurations, thus enabling the detection of magnetization aligned in different three-dimensional directions. In embodiments, it is envisioned that the resolution may be increased by a factor of 8 over the classical diffraction limit. Additionally, the described systems and methods may provide a more cost effective means for studying magnetic properties of materials with a spatial resolution below the diffraction limit, which is useful in scientific research and in industry for the characterization of magnetic materials. The sub-diffraction limited imaging methods and systems disclosed herein allow for the measurement of magnetic domains, and magnetic domain dynamics as well. For example, a single image can be captured in milliseconds with 25 nm spatial resolution. By using pump-probe or stroboscopic techniques, images can be captured with femtosecond time resolution to observe magnetic domain dynamics of samples and magnetic materials, which, for this spatial resolution, is only currently capable by using x-ray radiation from large synchrotron facilities that are extremely expensive and unavailable to most manufacturers and research laboratories. The sub-diffraction limited imaging magneto-optic microscopy systems described herein may capture images with sub-diffraction limited spatial resolutions of 25 nm for visible light and at 2500 frames/second. Additionally, the methods and systems described enable the generation of images with modulation transfer functions (MTFs) having corresponding values at higher frequencies than MTFs of images obtained without using the sub-diffraction limited spatial resolution described herein.

Additional benefits of the described methods and systems include that the technologies described are purely optical, realizable on a table top setup, easily amenable to different relevant sample environments, and are compatible with imaging at ultra-fast timescales (i.e., down to femtosecond time scale measurements). Further, the disclosed systems and methods allows for simplified image capture and measurements of the in-plane and perpendicular magnetization of domains under the application of arbitrarily large fields.

The sub-diffraction limited imaging methods and systems described involve creating a photonic nanojet using a lens-like dielectric micro-object. As described further herein, microspheres may be implemented as the micro-object to enhance image resolution and provide an increase in magnification of material contrast for imaging of nanostructured samples, and specifically for magneto-optic microscopy. Wide-field magneto-optic microscopy is commonly used as a commercial tool for magnetic imaging and characterization. The described methods provide a significant enhancement of capabilities for magneto-optic microscopy, that can be readily implemented in existing and new measurement setups.

In microscopy and other forms of imaging, the resolving power of an imaging system is defined as the ability of the system to separate images of two objects into independent, identifiably distinct images. The resolution of an imaging system provides a measure of the minimum resolvable distance between two distinguishable objects in an image. The resolution of an imaging system may be limited by aberrations due to optics and other sources of field distortion, or by diffraction causing the blurring of images. The resolution of imaging systems used in nanoscale measurements, such as magneto-optic microscopy systems, is often limited by the diffraction of the light in the system.

FIGS. 1A-10 illustrate overlapping image intensities (A.U.) of Airy discs for two point sources. For a microscopic system, the diffraction limited resolution is approximately defined by the equation, $$r = f_i \times \frac{\lambda}{NA},$$

where NA is the numerical aperture for the imaging system, $\lambda$ is the wavelength of the light or optical energy used in the imaging system, r is the distance between the peaks of the Airy discs (i.e., the resolution limit of the system), and $f_i$ is a criterion dependent constant which varies as defined by the Rayleigh, Abbe, or Sparrow limits. In the examples illustrated in FIGS. 1A-1C the wavelength of light was assumed to be 800 nm, and the numerical aperture was assumed to be 1.13. FIG. 1A illustrates a Rayleigh limit, or Rayleigh criterion, resolution scenario. The Rayleigh limit defines resolution using features of Airy discs, and specifically that two point sources are regarded as resolved when the principal diffraction maximum of one image Airy disc coincides with the first minimum of the second image Airy disc. The Rayleigh limit has an $f_i$=0.61, resulting in an image resolution of 431 nm for the scenario illustrated in FIG. 1A. FIG. 1B illustrates the Abbe limit which defines the resolution limit of two point sources to be when the intensities of the two equally bright Airy discs generated by the point sources overlap at half of the maximum intensity resulting in a criterion constant of $f_i$=0.5. The Abbe resolution limit in the scenario of FIG. 1B is 354 nm. The Abbe limit criterion results in greater overlap of the two Airy discs than exhibited in the Rayleigh limited diffraction and therefore, a smaller resolution compared to the scenario illustrated in FIG. 1A. Further, FIG. 1C illustrates the Sparrow resolution limit. The Sparrow limit defines the resolution limit as being at a distance when the combined intensity of the light from two overlapping, and equally bright, Airy disks is constant along a line between the central peak brightness of the two Airy disks. The Sparrow resolution limit is approximately two thirds of the Rayleigh limit in any given scenario. The criterion for determining the imaging resolution of an imaging system may be determined based on the level of accuracy required, or the specific application. For example, the Sparrow limit is often used for astronomical observations, while the Rayleigh and Abbe criterion are more commonly used for microscopy. As described herein, the resolution values shall be considered to be in reference to Rayleigh criterion resolutions. It should be understood that the super-resolution microscopy systems and methods described herein enable the imaging of objects at resolutions greater than any of the diffraction limited resolutions as defined by the Rayleigh, Abbe, and/or Sparrow limits.

The methods and systems described herein employ optical radiation and optical devices and elements to form a photonic nanojet to enable super-resolution microscopy. A photonic nanojet is a high-intensity, spatially narrow (i.e., exhibiting sub-wavelength full width at half max beam widths), non-evanescent optical beam that is able to propagate over distances longer than the wavelength of the optical beam. The high intensity and spatially confined nature of photonic nanojets enables the super-resolution imaging of a surface or material. Additionally, the propagation distances of the photonic nanojet allow for the implementation of the photonic nanojet for imaging in many practical imaging systems and applications. A photonic nanojet may be formed by focusing an optical beam into a micro-sphere, a micro-ellipse or cylinder, or another microlens as described further herein.

Figure 2:
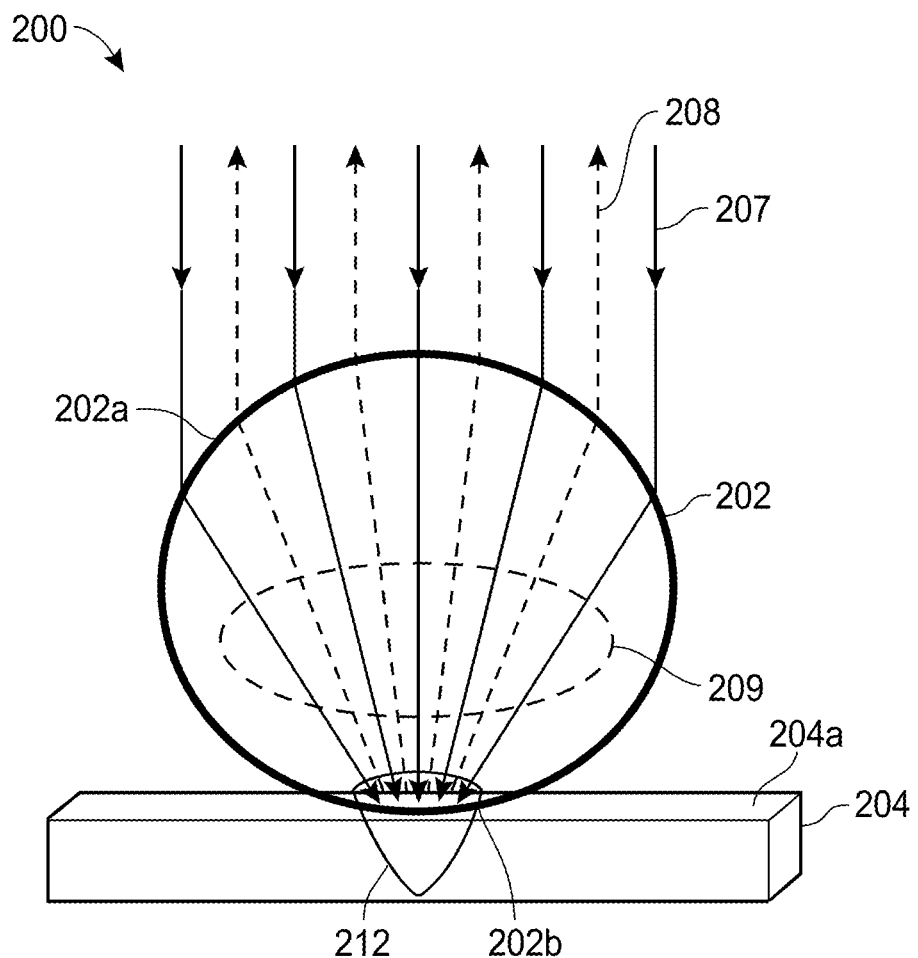
FIG. 2 illustrates an embodiment of a microlens arrangement for generating a photonic nanojet.

FIG. 2 illustrates an embodiment 200 of a microlens arrangement for generating a photonic nanojet. The embodiment includes a microlens 202, a sample 204, and incident light 207. The incident light 207 enters the microlens 202 through a first surface 202a of the microlens 202. The incident light 207 is focused inside of the microlens 202, as illustrated by the converging rays 209, and exits the microlens 202 through a second surface 202b of the microlens 202. The light exiting the microlens 202 forms a photonic nanojet 212 that is incident on a surface 204a of the sample 204. Some of the light of the photonic nanojet 212 may transmit through the surface 204a of the sample 204, passing into to the sample 204, and may then be reflected by the sample 204 or may be absorbed. Some of the light of the photonic nanojet 212 may transmit through the surface 204a of the sample 204 and propagate through the entirety of the sample 204. Some of the light of the photonic nanojet 212 may be reflected off of the surface 204a of the sample 204. The reflected light 208, illustrated by the dotted rays in FIG. 2, may propagate back through the second surface 202b of the microlens 202, through the microlens 202, and exit the first surface 202a of the microlens 202 to further be filtered, manipulated, detected, and/or observed.

As illustrated in FIG. 2, the microlens 202 may be a microsphere with a diameter on the order of microns, to tens of microns. The microlens 202 may be made of a glass, a plastic, a liquid (e.g., an oil, a high refractive index liquid), gas (e.g. air) or another substantially optically transparent material with an index of refraction and geometry capable of forming a photonic nanojet. The diameter of a microsphere as the microlens 202 may vary greatly depending on the index of refraction contrast between the microsphere material, and the environment of the microsphere, which may be a solid (e.g., a glass or plastic), gas, or liquid. Depending on the index of refraction of the microsphere, the refraction index of the environment, the wavelength of light, and the diameter of the microsphere, the beamwidth of the nanojet 212 may be smaller than the classical diffraction limit, and may be as small as one third of the wavelength of the light for microspheres.

The photonic nanojet 212 is a narrow, high-intensity electromagnetic beam that propagates out of the microlens 202 through the second surface 202b of the microlens 202. The photonic nanojet 212 is a non-evanescent propagating beam that can maintain a subwavelength full-width at half-maximum (FWHM) transverse beamwidth that can propagate distances of more than two times the optical wavelength of the light outside of the microlens 202. The minimum FWHM beamwidth of the photonic nanojet 212 can be smaller than the classical diffraction limit, and, for microspheres, the FWHM beamwidth may be as small as one fourth of the optical wavelength of the light. The photonic nanojet 212 is a non-resonant phenomenon allowing for the use of a wide range of microlens geometries. Additionally, the photonic nanojet 212 has a high intensity that can significantly exceed that of the incident light 207 illuminating wave. A portion of photons of the photonic nanojet 212 may reflect off of the sample 204, while other photons of the photonic nanojet 212 may propagate through the surface penetrating the sample 204. The light that penetrates into the sample 204 may be absorbed by the sample 204, scattered in the sample 204, propagate through the sample 204, or be reflected or scattered back through the surface 204a of the sample 204. In embodiments, the photonic nanojet 212 penetrates approximately tenths of nanometers into the sample 204 before the photonic nanojet 212 is substantially reflected by the sample 204. The reflected light 208 may be further manipulated, processed, and detected to determine properties of magnetic domains of the surface 204a of the sample 204. Additionally, the microlens 202 preserves the polarization of the light which may help in simplifying the analysis of the changes in the polarization of the light for performing magneto-optic microscopy imaging. Further, in embodiments, the microlens 202 may in practice be a plurality of microlenses 202 in a microlens layer. The microlens layer may allow for the imaging of multiple portions of the surface 204a of the sample 204 simultaneously or sequentially.

Figure 3:
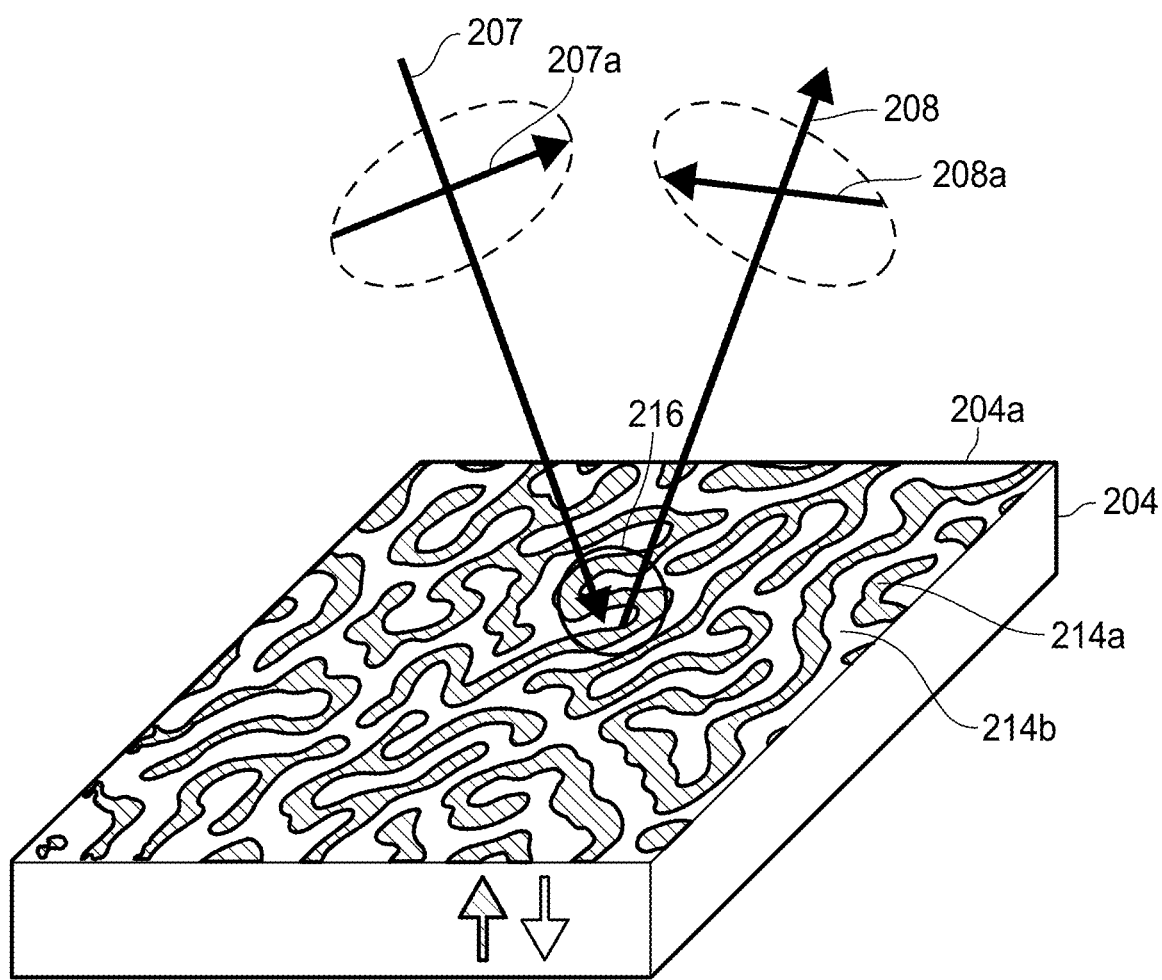
FIG. 3 illustrates an example scenario of the magneto-optical Kerr effect (MOKE) phenomena.

FIG. 3 illustrates an example scenario 300 of the magneto-optic phenomena. A sample 204 having magnetic domains has a surface 204a that is probed using incident light 207. The sample 204 has an up magnetic domain 214a within which the magnetization is directed perpendicular to the surface 204a and pointed upward, illustrated by the shaded regions on the surface 204a of the sample 204, and a down magnetic domain 214b within which the magnetization is directed perpendicular to the surface 204a and pointed downward, illustrated by the white regions on the surface 204a of the sample 204. Incident light 207, having a first polarization 207a and a first polarization intensity, is incident on the surface 204a of the sample 204 at a point of incidence 216, or an incident region. The light is reflected off of the surface 204a of the sample 204 resulting in reflected light 208 having a second polarization 208a and a second polarization intensity. The reflected light 208 may then be optically processed using a polarizer, and a detector/analyzer to determine the change in the polarization and the change in the polarization intensity of the reflected light 208 compared to the incident light 207. The change in the polarization direction and intensity may be indicative of a direction and/or strength or amplitude of a magnetic domain at the incident region or point of incidence 216. Typically, the change in the direction of the polarization from the first polarization 207a to the second polarization 208a is dependent upon the direction of the magnetization in the domain at the portion of the surface 204a of the sample 204 that is being probed. Additionally, the change in the intensity, or vector length, of the first polarization 207a relative to the second polarization 208a is typically dependent on the strength of the magnetization in the domain at the portion of the surface 204a of the sample 204 that is being probed.

Figure 4:
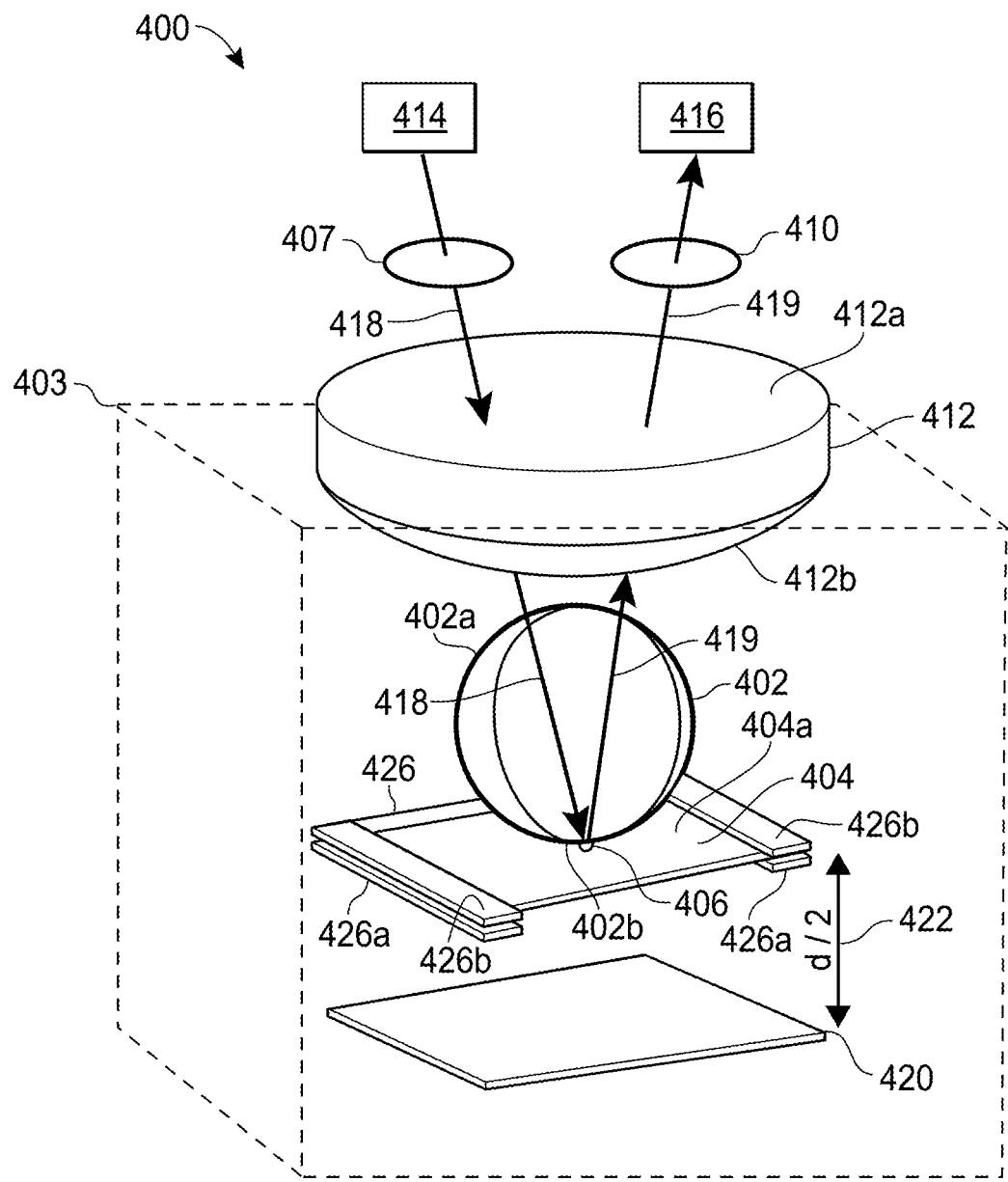
FIG. 4 illustrates an embodiment of a microscopy system for performing super-resolution MOKE microscopy.

FIG. 4 illustrates an embodiment of a microscopy system 400 for performing super-resolution magneto-optic microscopy as described herein. The microscopy system 400 includes a microlens 402 in an immersive medium 403, a sample 404, a first polarizer 407, a second polarizer 410, an imaging lens 412, an optical source 414, and an optical detector 416, also referred to as an imaging sensor. In embodiments, one or more optical elements such as a condenser, ocular lens, etc. may be included in any of the imaging lens 412, optical source 414, and/or optical detector 416 to perform the functions required herein for magneto-optic microscopy. The optical source 414 is configured to provide optical energy, or optical radiation in the form of incident light 418. The optical source 414 may include one or more of a light emitting diode (LED), organic light emitting diode (OLED), a laser diode (LD), a black body source, or another device capable of emitting optical radiation. Additionally, the optical radiation may include ultraviolet radiation, visible radiation, infrared radiation, microwave radiation, black body radiation, or another type of optical radiation for performing microscopy. In embodiments, the optical radiation has a wavelength of between 100 to 300 nanometers, 350 to 800 nanometers, 400 to 500 nanometers, 500 to 800 nanometers, or greater than 800 nanometers. The optical radiation may have any wavelength configured to allow for the focusing of the optical radiation to form a photonic nanojet 406 as described herein. The first polarizer 407 polarizes the incident light 418 to ensure that the radiation has a predetermined, or otherwise known, polarization. In embodiments, the first polarizer 407 may include a single optical element such as a single polarizing filter. In other embodiments, the first polarizer 407 may include multiple optical elements including one or more of a polarizing filter, a half waveplate, a quarter waveplate, a linear polarizer, a circular polarizer, a beam-splitting polarizer, an absorptive polarizer, a thin film polarizer, a wire-grid polarizer, or another type of optical polarizing element.

The incident light 418 propagates into the immersive medium 403. The immersive medium 403 has a refractive index selected to enable the formation of a photonic nanojet 406, as explained further below in describing the microlens 402 and photonic nanojet 406. In embodiments, the imaging lens 412 may be entirely immersed in the immersive medium 403, partially immersed in the immersive medium 403, or may not be in contact with the immersive medium 403. In embodiments, a first surface 412a of the imaging lens 412 may not be immersed in the immersive medium 403, and a second surface 412b may be immersed in the immersive medium 403 such that the incident light 418 entering the imaging lens propagates from an air interface through the first surface 412a of the imaging lens, propagates through the imaging lens 412, and exits the imaging lens 412 through the second surface 412b of the imaging lens 412 into the immersive medium 403.

In embodiments, the optical source 414, first polarizer 407, and imaging lens 412 are configure to provide the incident light 418 to the microlens 402 at an angle that is substantially perpendicular to a surface 404a of the sample 404, which is referred to herein as an out-of-plane measurement configuration. The out-of-plane measurement configuration, also referred to as a polar measurement, is useful for imaging magnetic domains with magnetization vectors or directional components that are substantially perpendicular or normal to the surface 404a of the sample 404. In-plane measurements, also referred to as longitudinal measurements, may be performed by increasing the angle of incidence of the incident light 407 on the surface 404a of the sample 404. In-plane measurements are useful for imaging of magnetic domains with magnetization vectors or directional components that are substantially parallel to the surface 404a of the sample 404.

The incident light 418 propagates through the immersive medium 403 and enters the microlens 402 through a first surface portion 402a of the microlens. The microlens 402 focuses the incident light 418 and the incident light 418 exits the microlens through a second surface portion 402b of the microlens 402. The immersive medium 403 has a refractive index selected to enable the microlens 402 to focus the incident light 418 to generate the photonic nanojet 406. The formation of the photonic nanojet 406 is dependent on the wavelength of the light, geometries of the microlens 402 (e.g., a microsphere, an aspheric lens, a concave/convex lens, etc.), the refractive index of the microlens 402, the refractive index of the immersive medium 403, and the ratio of the refractive indices of the microlens 402 and immersive medium 403. For example, in embodiments that employ a microsphere as the microlens 402, the refractive index of the immersive medium 403 may be less than the refractive index of the microsphere to form the photonic nanojet 406. In embodiments, the immersive medium 403 may be a solid material, a liquid, a gas, or a vacuum, as long as the refractive index of the immersive medium 403 is sufficient to allow for the formation of the photonic nanojet 406. Additionally, the immersive medium 403 may include a material that is housed inside of another material for example, a gas contained within a solid casing, or a gas contained within holes of a solid, a liquid contained within holes of a solid, or a liquid or gas contained within grid etchings or a honeycomb of a solid material, or another configuration of liquid, gasses, and solids, to achieve a desired refractive index of the medium 403 to enable the formation of the photonic nanojet 406. In embodiments, the refractive indices of the immersive medium 403 and the microlens 402 may be wavelength dependent.

The incident light 418 exiting the second surface portion 402b of the microlens 402 forms the photonic nanojet 406 that is incident on a surface 404a of the sample 404 for imaging of the surface 404a. In embodiments, the second surface portion 402b of the microlens 402 is at a distance of less than 20 nanometers, 40 nanometers, 50 nanometers, 100 nanometers, 200 nanometers, 400 nanometers, or less than 1 micron away from the surface 404a of the sample 404. In embodiments, the second surface 402b of the microlens 402 is in direct physical contact with the surface 404a of the sample 404. Photons of the photonic nanojet 406 are reflected by the sample 404 resulting in reflected light 419, which propagates into the microlens 402 through the second surface portion 402a of the microlens 402. The reflected light 419 propagates through the microlens 402 and exits the microlens 402 through the first surface portion 402a of the microlens 402. The reflected light 419 propagates through the immersive medium 403 and is collected by the imaging lens 412. The reflected light 419 propagates through the second surface 412b of the imaging lens 412, through the imaging lens 412, and exits the imagine lens 412 through the first surface 412a of the imaging lens 412.

The second polarizer 410 polarizes the reflected light 419 before the reflected light 419 is collected, or detected by the optical detector 416. The second polarizer 410 may include a single optical element, such as a polarizing filter, or the second polarizer 410 may include multiple optical elements such as one or more of a polarizing filter, a half waveplate, a quarter waveplate, a linear polarizer, a circular polarizer, a beam-splitting polarizer, an absorptive polarizer, a thin film polarizer, a wire-grid polarizer, or another type of optical polarizing element. The second polarizer 410 is configured to transmit light having a desired polarization to be detected by the optical detector 416. In embodiments, the second polarizer 410 is configured to transmit light that has a polarization approximately 90° rotated compared to the polarization of the incident light 417. For example, the second polarizer 410 may be configured to transmit light at a rotation of 90°±3°, 90°±5°, 90°±10°, or transmit light at a rotation within a desired tolerance for performing magneto-optical microscopy as described herein. In embodiments, the second polarizer 410 may include multiple wave plates and polarizing filters that may be tunable to adjust the polarization of the light transmitted by the second polarizer 410. For example, the second polarizer 410 may be configured to transmit substantially horizontally polarized light for one microscopy measurement or image, and the second polarizer 410 may be reconfigured (e.g., by adjusting waveplates and/or polarizing filters) to transmit substantially circularly polarized light for another measurement or image. In embodiments, the second polarizer 210 may be configured to transmit, horizontally polarized light, vertically polarized light, circularly polarized light, elliptically polarized light, diagonally polarized light, or linearly polarized light.

The optical detector 416, or imaging sensor, is configured to detect the reflected light 419 that is transmitted by the second polarizer 410. In embodiments the optical detector 419, or imaging sensor, may be one or more photodiodes, one or more avalanche photodiodes, a charge-coupled device, a CMOS imaging sensor, or another camera or sensor for detecting the reflected light 419 and generating an electrical signal indicative of an image of the surface 404a of the sample 404. The intensity of the polarization filtered reflected light 419 may then be determined, and further, a polarization difference between the reflected light 419 and the incident light 418 may be determined. The polarization difference may be used to determine the direction and strength of a magnetic moment of a magnetic domain of the sample 404. The sample 404 may be mounted or physically coupled to a translation stage 426 that translates the sample 404 in two dimensions to enable MOKE microscopy imaging of the entire surface 404a of the sample 404. The translation stage 426 is illustrated in FIG. 4 as a frame having a bottom panel 426a and a top panel 426b. the sample is placed between the top panel 426b and the bottom panel 426a for the sample to rest on the bottom panel 426a during imaging. The top panel 426b may be adjustable to clamp down onto the sample 404 to ensure that the sample 404 remains in a fixed position relative to the translation stage 426. In embodiments, the translation stage may include a single bottom plate that the sample rests on during imaging, one or more alligator clips, one or more clamps, an adhesive, or another measure for holding the sample 404 in a fixed position relative to the translation stage 426 during imaging. Additionally, the translation stage 426 also includes translation components for movement of the translation stage (not pictured) such as rollers, recirculation ball bearings, springs, shafts, stages, flexures, cylindrical sleeves, rail screws, dovetails, stepper motors, manual control knobs, and DC motors. The sample 404 may be mounted or physically coupled to a three-dimensional translation stage to allow for the adjusting of the distance between the sample 404 and the imaging lens 412. In embodiments, the sample 404 may be mounted on a translation stage having any number of translational and/or rotational capabilities to provide control over the region of the sample 404 being imaged, and to control the distance from the sample 404 to the imaging lens 412 to control focusing of the imaging lens 412 for imaging of the magnetic domains of the sample 404. In embodiments, the imaging lens 412 may be physically coupled to a translation stage to control focusing of the imaging lens for performing MOKE microscopy imaging of the sample 404.

As one of ordinary skill in the art would recognize, a virtual image is an optical image formed from the divergence of light rays from a point or object, as opposed to a real image which is an image formed by a collection of converging rays of light. Virtual mages are formed by plane mirrors, diverging lenses, convex mirrors and other optical elements and systems. The configuration of the microscopy system 400 illustrated in FIG. 4 results in the formation of a virtual image 420 at a distance 422 away from the surface 404a of the sample 404. The distance 422 of the virtual image 420 is determined by the geometries of the microlens 402. For example, in embodiments with a microsphere as the microlens 402, the distance of the virtual image 420 to the surface 404a of the sample 404 is one half of the diameter of the microsphere. Other microlens geometries may result in the virtual image 420 being at distances greater or less than the distance for a microsphere. The generation of the virtual image 420 is important for the super resolution capabilities of the microscopy system 400. Focusing the imaging lens 412 on the surface 404a of the sample 404 results in diffraction limited resolutions (i.e., Rayleigh, Abbe, and Sparrow limited image resolutions) as described above. Therefore, to realize the super-resolution capabilities of the microscopy system 400 the imaging lens 412 should be focused on the virtual image 420. In embodiments, the imaging lens 412 may be spatially translated to focus on the virtual image 420. In embodiments, the microlens 404 may be a single microlens or a microlens layer that is physically coupled to a microlens layer holder. The microlens layer holder may be a transparent plate or cuvette that holds or contains the microlens 402 or microlens layer. The microlens layer holder may be translatable relative to the imaging lens 412 to provide the virtual image 420 to the imaging lens 412 and to bring the virtual image into the focus of the imaging lens 412. The microlens holder may be a rigid honeycomb structure, a viscous oil or solid material, or another material or structure capable of holding the microlens 402 or microlens layer.

While described herein as being a microsphere, the microlens 402 may be a lens having two spherical surfaces with different radiuses of curvature, a lens having one or more aspherical surfaces, a lens having one or more hyperbolic surfaces, or a lens having one or more elliptical surfaces. In embodiments, the microlens 402 may include a lens having at least one of a concave surface, a convex surface, or a combination of concave and convex surfaces. In any embodiments, the microlens 402 may have surfaces that are separated by a distance configured to enable to formation of the photonic nanojet 406. Additionally, the microlens 402 may be coated with a material to assist in the generation of the photonic nanojet 406, or to reduce reflections of the incident and reflected light 418 and 419 to increase the efficiency of the microscopy system 400. In embodiments, the microlens 402 preserves the polarization of the light propagating through the microlens to allow for analysis of the polarization of light, and the amplitude of the light having a specific polarization, for performing MOKE microscopy imaging. In embodiments, the microlens 402 may alter the polarization of the light propagating through the microlens 402 by a fixed amount resulting in a polarization shift, which may be linearly dependent on refractive indices of the microlens material (e.g., a birefringent material) and/or may depend on the thickness of the microlens 402.

Figure 5:
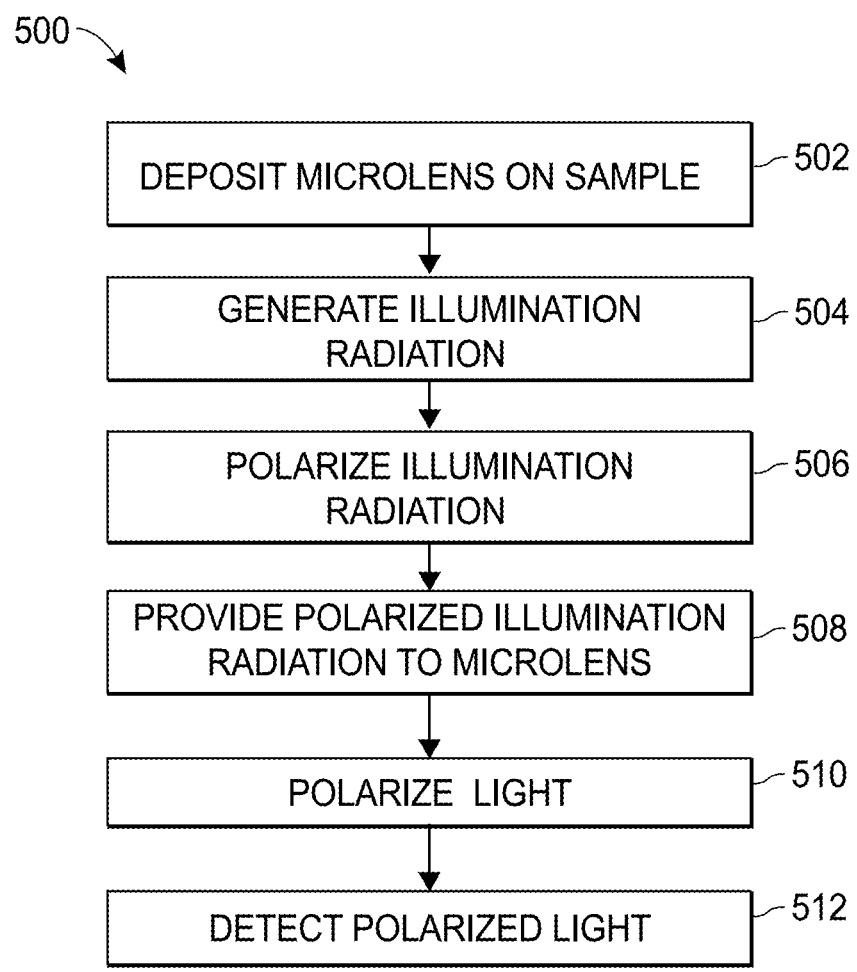
FIG. 5 is a flow diagram of an embodiment of a method for performing super-resolution MOKE microscopy.

FIG. 5 is a flow diagram of an embodiment of a method 500 for performing super-resolution MOKE microscopy, according to the embodiments described herein. The method 500 includes depositing a microlens onto the surface of a sample (block 502). The microlens may be one of a plurality of microlenses deposited on the sample. The deposition of the microlens may include physically suspending the microlens in a medium at a position relative to the surface of the sample. In embodiments, the deposition of the microlens may include placing the microlens in direct physical contact with the surface of the sample. A plurality of microlenses may be deposited by sedimentation wherein multiple microlenses of the plurality of microlenses sinks to the surface of the sample which may cause the microlenses, to assemble into a monolayer on or above the sample. In embodiments, the microlens may be suspended in a solid or liquid, and the sample may be positioned relative to the microlens for imaging of the surface of the sample. For example, a plurality of microlenses may be suspended inside of a honeycomb structure and the sample may be positioned to allow for MOKE microscopy of the surface of the sample. Such a honeycomb microlens embodiment would allow for simple translation of the sample, or the honeycomb, relative to imaging optics to image different regions of the surface of the sample.

The method 500 further includes, generating illumination radiation (i.e., the incident radiation 418 of FIG. 4) (block 504) and polarizing the illumination radiation (block 506). The illumination radiation may be generated by an LED, an incandescent lamp, an arc lamp, a laser diode, an OLED, a black body radiation source, an ultraviolet radiation source, and infrared radiation source, or another optical source. Polarizing the illumination radiation may include employing one or more of a polarizing filter, a quarter waveplate, a half waveplate, a circular polarizer, or another polarizing optical element as described herein. The method 500 additionally includes providing the polarized illumination radiation to the microlens (block 508). Providing the polarized illumination radiation to the microlens may include providing the illumination radiation to optical elements such as one or more lenses, filters, waveplates, prisms, mirrors, gradients, optical fibers, or waveguides to direct the illumination radiation to the microlens. The illumination radiation may then be focused by the microlens to form the photonic nanojet for imaging of the surface of the sample.

The microlens forms a virtual image of the surface of the sample by collecting reflected light from the surface of the sample. Imaging optical elements such as mirrors, lenses, filters, etc. may then further process or manipulate the reflected light. A second polarizer polarizes the reflected light (block 510). Polarizing the reflected light may include employing one or more of a polarizing filter, a quarter waveplate, a half waveplate, a circular polarizer, a Wollaston prism, or another polarizing optical element as described herein. The method 500 further includes, detecting the polarized reflected light by an optical detector (block 512). The intensity of the polarized light may be analyzed to determine the strength and direction of a magnetic domain of the surface of the sample. Additionally, the first and second polarizers may be tuned to vary the polarization of the illumination radiation, and the polarization of the transmitted reflected radiation to perform a more robust analysis of the strengths and directions of magnetic domains of the surface of the sample. While described herein as reflected light, the illumination radiation may undergo a Faraday rotation by forming a photonic nanojet that is transmitted through the sample. The transmitted radiation may then be polarized at block 510 and further detected at block 512 for performing the magneto-optical microscopy methods described herein.

Figure 6:
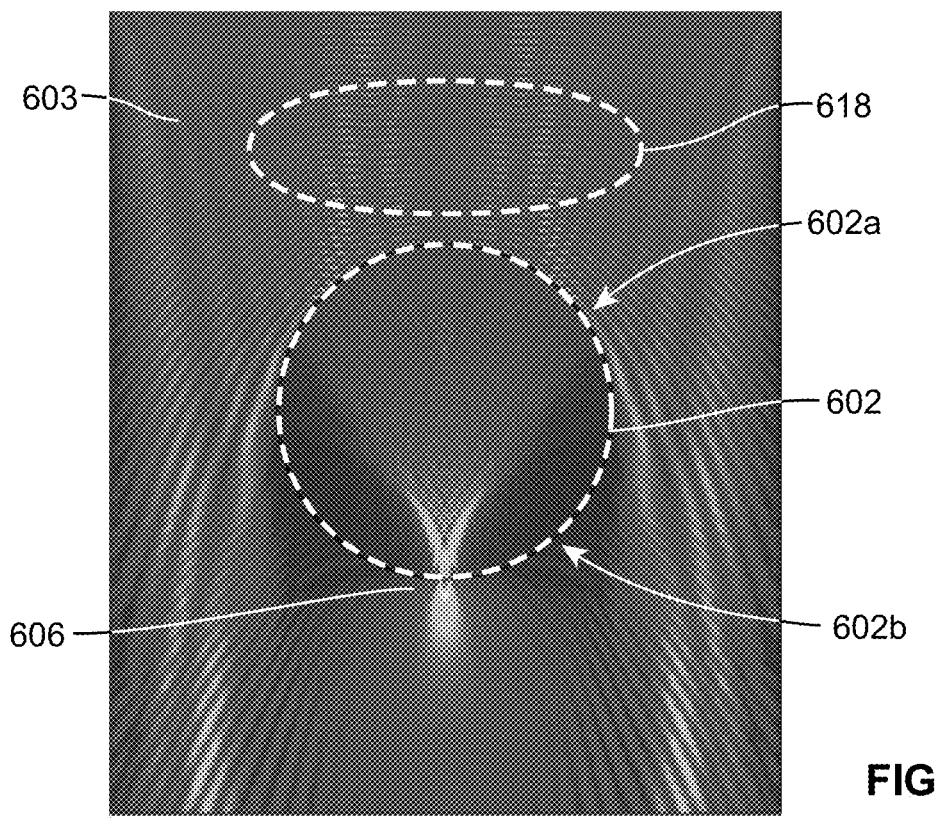
FIG. 6 is a two-dimensional simulated field-emission microscopy image of a microlens in the form of a microsphere configured to form a photonic nanojet.

FIG. 6 is a two-dimensional simulated finite elements simulation 600 of a microlens, such as the microlens 402 of FIG. 4, in the form of a microsphere 602 configured to form a photonic nanojet 606. The image shows incident radiation 618 propagating in an immersive medium 603 entering the microsphere 602 through a first surface portion 602a of the microsphere 602. The incident radiation 618 is focused to a point on or near a second surface portion 602b of the microsphere 602. The incident radiation 618 forms a photonic nanojet 606 as the radiation exits the second surface portion 602b of the microsphere 602. The microsphere 602 of FIG. 6 has a radius of 2.5 microns, and a refractive index of 1.9. The immersive medium 603 has a refractive index of 1.9. The image 600 of FIG. 6 is one embodiment of a microlens immersed in an immersion material configured to generated a photonic nanojet for performing super-resolution MOKE microscopy.

Figure 7:
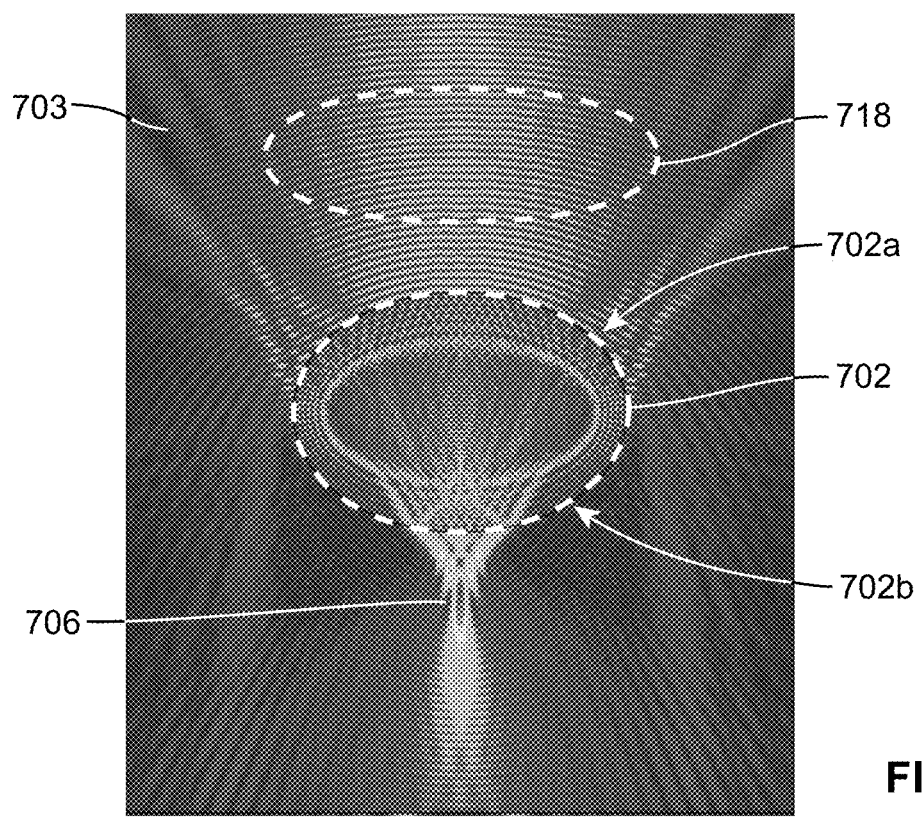
FIG. 7 is a finite elements simulation image of a microlens in the form of an elliptical microlens configured to form a photonic nanojet.

FIG. 7 is a finite elements simulation image 700 of a microlens in the form of an elliptical microlens 702 configured to form a photonic nanojet 706. The image shows incident radiation 718 propagating in an immersive medium 703 entering the elliptical microlens 702 through a first surface portion 702a of the elliptical microlens 702. The incident radiation 718 is focused to a point on or near a second surface portion 702b of the elliptical microlens 702. The incident radiation 718 forms the photonic nanojet 706 as the radiation exits the second surface portion 702b of the elliptical microlens 702. The elliptical microlens 702 of FIG. 7 has a major axis radius of 3 microns, a minor axis radius of 2 microns, and a refractive index of 3.6. The immersive medium 703 has a refractive index of 1.3. The image 700 of FIG. 7 is one embodiment of a non-spherical microlens for forming a photonic nanojet to perform super-resolution MOKE microscopy.

Examples

In a specific example, barium titanate ($BaTiO_3$) microspheres were implemented as microlenses, such as the microlens 202 of FIG. 2 or the microlens 404 of FIG. 4, for performing super-resolution magneto-optical microscopy on a structured sample (e.g., permalloy dot or antidot arrays) to measure the magnification increase resolution improvement resulting from the microlens. In embodiments, the microsphere may be a silicon oxide or a poly(methyl methacrylate) PMMA Acrylic materials. The microspheres had a diameter of between 38 and 45 microns, and a refractive index of 1.95. The microspheres were immersed in immersion oil with a refractive index of 1.56. In embodiments, the immersion oil may have a refractive index of about 1.56±0.1, and the microspheres may have a refractive index of about 1.95±0.1. In embodiments, the immersion oil may have a refractive index of between 1.3 and 2, and the microspheres may have an index of refraction of between 1.5 and 2.2. The resultant microscopy system had a diffraction limited lateral resolution of 130 nanometers. The diffraction limited lateral resolution was calculated using the Abbe limit as previously described. The optical source was a mercury arc lamp light source having a wide optical spectrum from approximately 320 nm to 780 nm. An ultraviolet filter was used to block all wavelengths below 340 nm, and therefore 340 nm is the shortest wavelength used in the following examples. Along with a numerical aperture of 1.3, the Abbe limit, and shortest wavelength of 340 nm were used to determine the resolution limit of 130 nm.

Figure 8A:
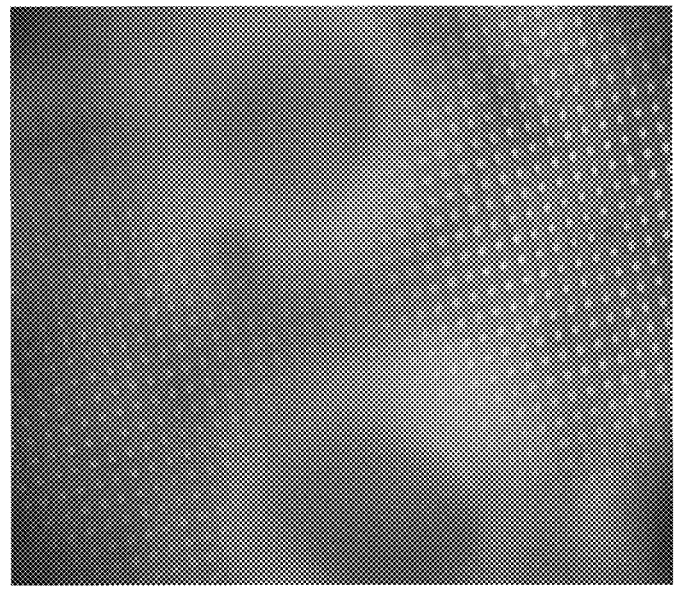
FIG. 8A is a MOKE microscopy image of a permalloy dot array sample captured by focusing the imaging optics on the surface of the sample.
Figure 8B:
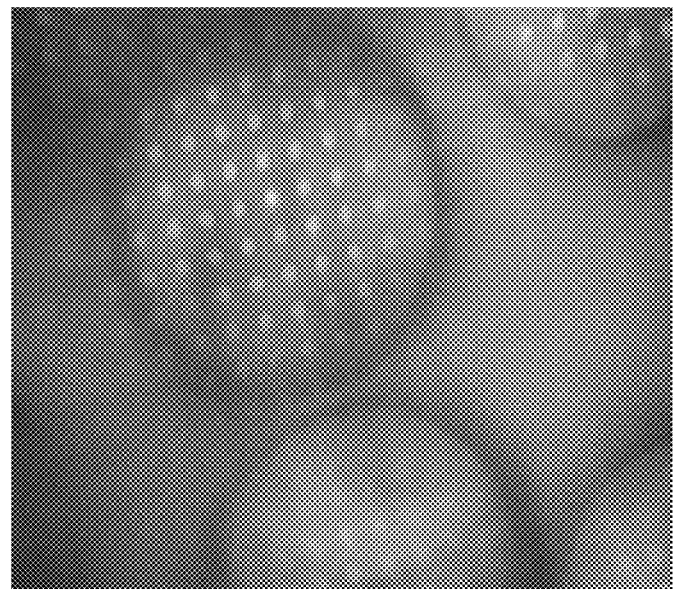
FIG. 8B is a MOKE microscopy image of a permalloy dot array sample captured by focusing the imaging optics on a virtual image of the surface of the sample.

FIGS. 8A and 8B are magneto-optical microscopy images of a permalloy ($Ni_{80}Fe_{20}$) dot array sample. The permalloy dots were flat dots on a silicon substrate that had a diameter of 1.3 microns and a periodicity of 2.4 microns. FIG. 8A is an image captured by focusing the imaging optics on the surface of the permalloy sample. FIG. 8B is an image captured by focusing the imaging optics approximately 22 to 26 microns below the surface of the sample on a virtual image of the surface of the sample, as described previously herein. Together, the images of FIGS. 8A and 8B allowed for the determination of the magnifying power, and a corresponding resolution improvement, of the microspheres. The resolution of FIG. 8B is approximately 2.5 times greater than the resolution of FIG. 8A which will be quantified and discussed further in reference to FIGS. 11A and 11B.

Figure 9A:
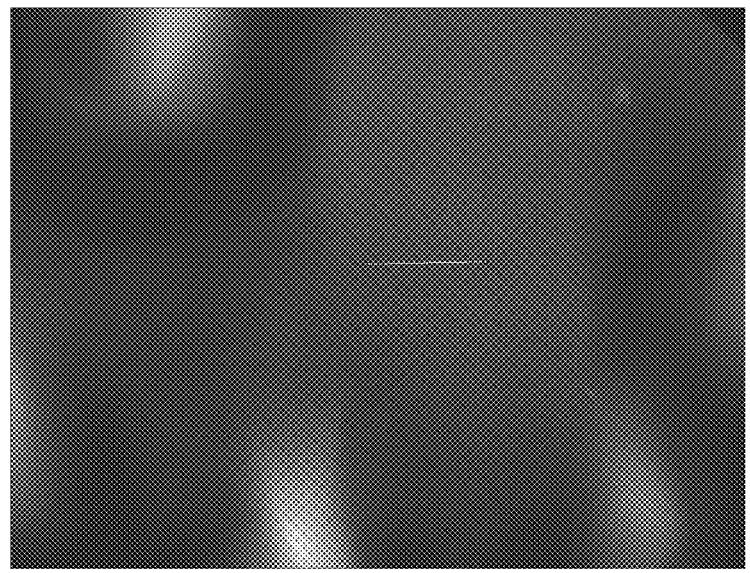
FIG. 9A is a MOKE microscopy image of a permalloy anti-dot array sample captured by focusing the imaging optics on the surface of the permalloy sample.
Figure 9B:
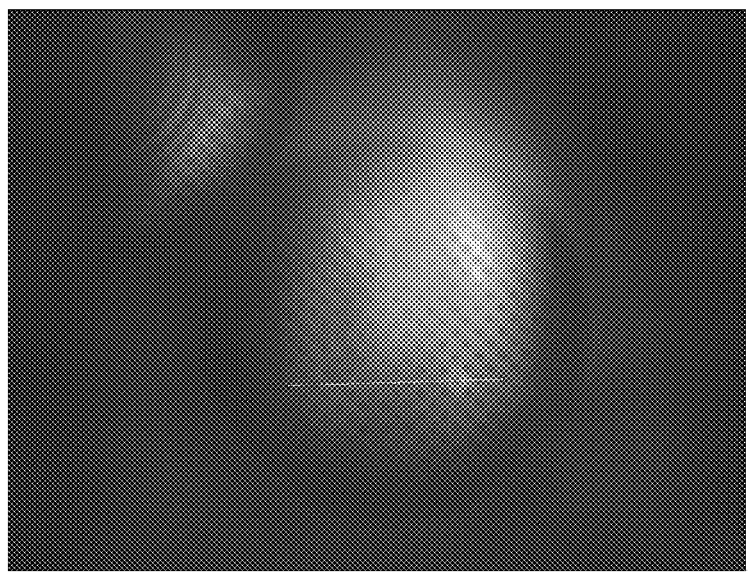
FIG. 9B is a MOKE microscopy image of a permalloy anti-dot array sample captured by focusing the imaging optics on a virtual image of the surface of the sample.

FIGS. 9A and 9B are magneto-optical microscopy images of a permalloy ($Ni_{80}Fe_{20}$) anti-dot array sample. The anti-dots had a diameter of 0.2 microns and a periodicity of 0.5 microns across the permalloy sample substrate. FIG. 9A is an image captured with the imaging optics being focused on the surface of the permalloy sample. The line in FIG. 9A spans across 10 anti-dots and 215 image detector pixels. FIG. 9B is an image captured with the imaging optics being focused on a virtual image of the surface of the sample. The line in FIG. 9A spans across 10 anti-dots and 390 image detector pixels. The image of FIG. 9B has a 1.8 times magnification increase compared to the image of FIG. 9A, illustrating the ability to image at higher resolutions, and therefore increased magnifications, using the systems and methods described herein.

Figure 10A:
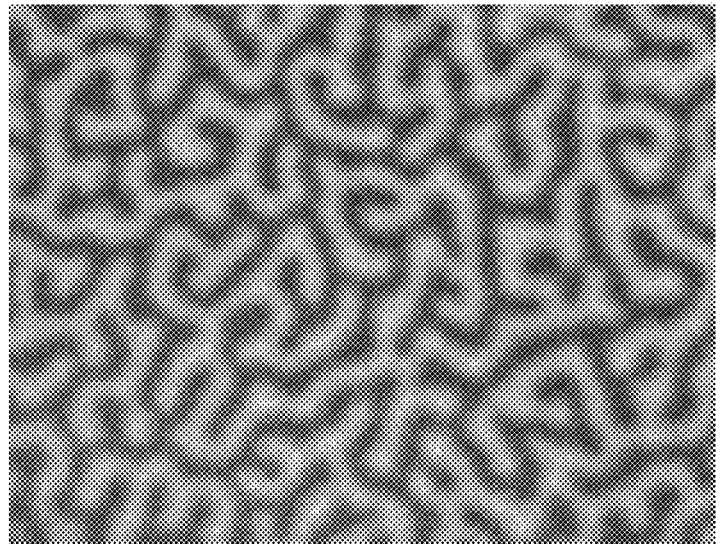
FIG. 10A is a MOKE microscopy image of a magnetic sample having a first magnetic domain and a second magnetic domain captured by focusing the imaging optics on the surface of the magnetic sample.
Figure 10B:
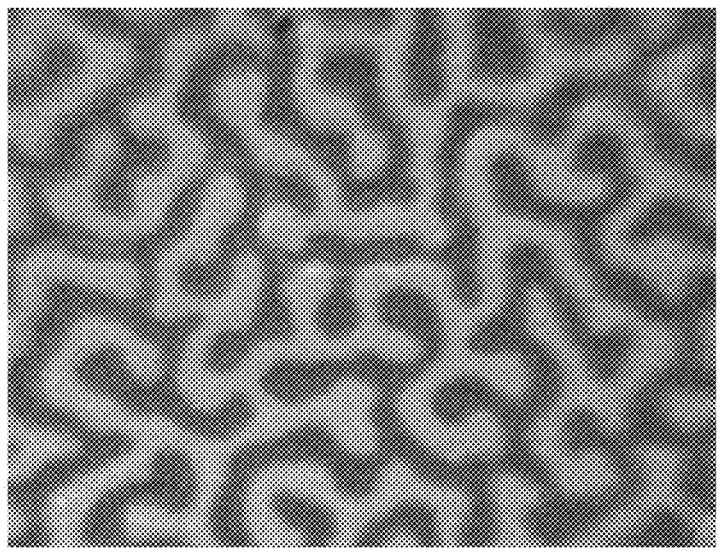
FIG. 10B is a MOKE microscopy image of a magnetic sample having a first magnetic domain and a second magnetic domain captured by focusing the imaging optics on a virtual image of the surface of the sample.
Figure 10C:
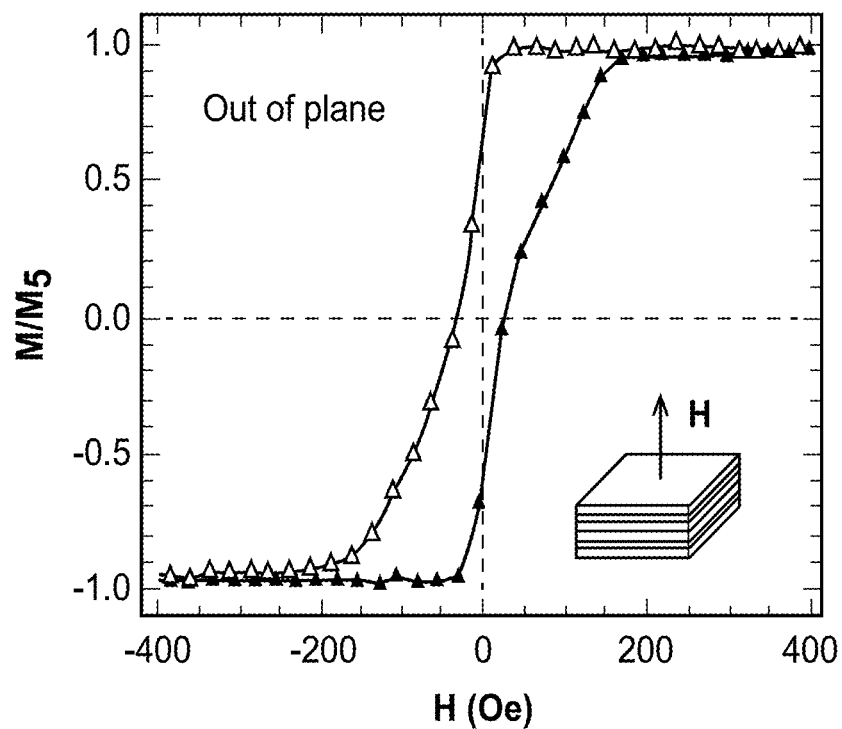
FIG. 10C is a plot of an out-of-plane magnetometry measurement of a magnetic sample.
Figure 10D:
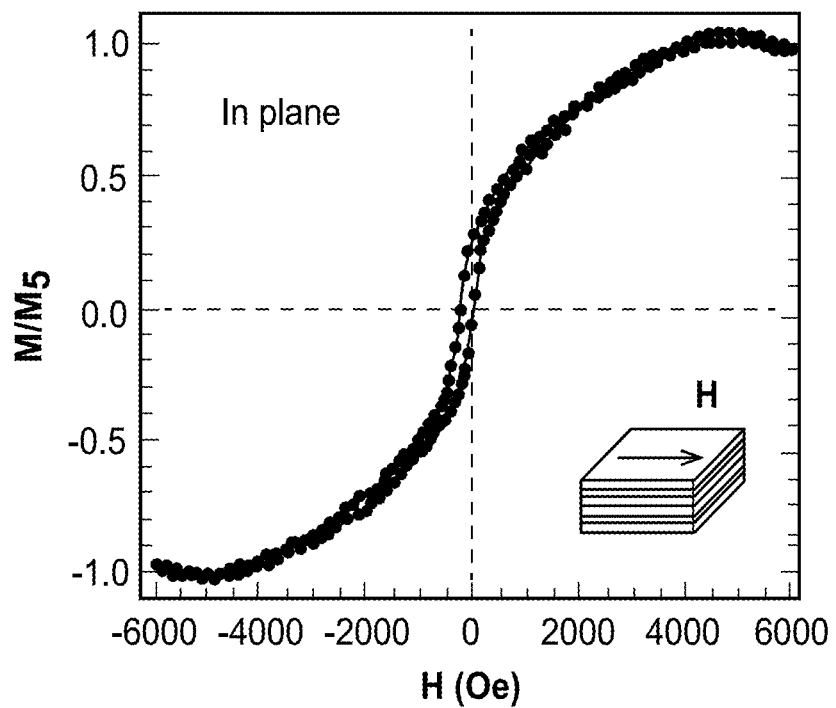
FIG. 10D is a plot of an in-plane magnetometry measurement of a magnetic sample.

In another example, a magnetic sample was used having multiple magnetic domains to demonstrate the resolution improvement of the systems and methods described herein when imaging magnetic domains. Super-resolution MOKE Microscopy was performed on a sample having cobalt gadolinium platinum (CoGdPt) multilayers with perpendicular magnetic anisotropy. The measurement was performed in a polar MOKE configuration that, as previously described, is more sensitive to out-of-plane magnetization. The specific sample used had 8 CoGdPt multilayers stacked on a silicon dioxide substrate that was coated in tantalum and platinum. The sample had a capping aluminum coating on top of the 8 CoGdPt stacks to prevent oxidation. Cobalt exhibits a large magneto-optical Kerr effect resulting in high contrast MOKE microscopy images. FIG. 10A is a MOKE microscopy image of the magnetic sample showing a first magnetic domain (darker regions) and a second magnetic domain (lighter regions) captured by focusing the imaging optics on the surface of the magnetic sample. FIG. 10B is a MOKE microscopy image of the magnetic sample showing a first magnetic domain (darker regions) and a second magnetic domain (lighter regions) captured by focusing the imaging optics on a virtual image of the surface of the sample. FIGS. 10C and 10D are plots of magnetometry measurements of the magnetization of the magnetic sample verses an applied magnetic field. The small arrows in the inset indicate the direction of the applied magnetic field and the direction along which the magnetization (i.e. magnetic moment density) is measured. The hysteresis loop of FIG. 10C shows that the sample exhibits two magnetic states with high values of the magnetization and with only a narrow transition region, when the field is applied out of plane. FIG. 10D illustrates very gradual change in the magnetization when the magnetic field is applied along the plane of the surface of the sample. These indicate that the magnetization has primarily out of plane components. Therefore, a higher contrast image will be obtained by probing the magnetic domains that have the magnetization directed perpendicular to the plane of the magnetic sample stacks (i.e., an out-of-plane measurement).

Figure 11A:
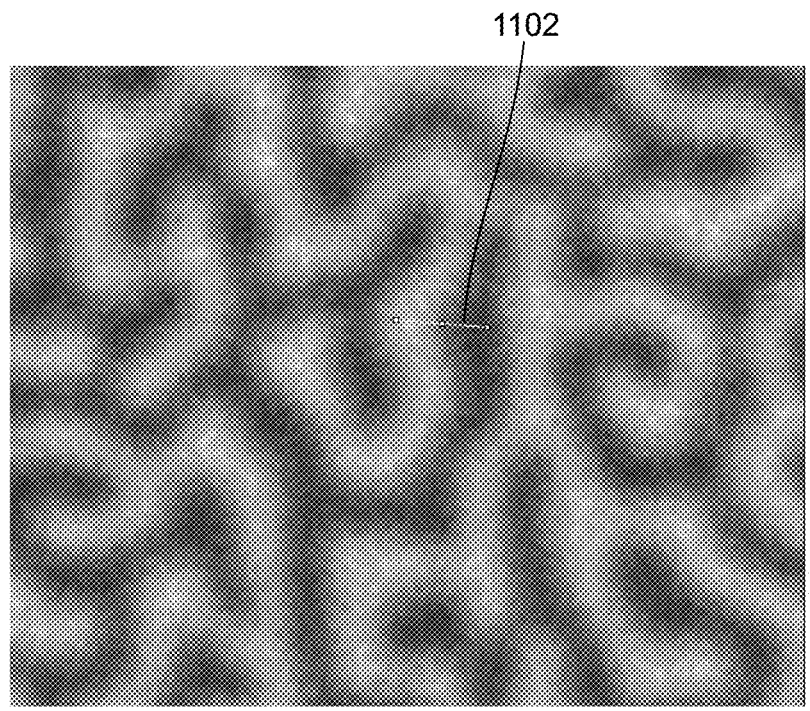
FIG. 11A is a MOKE image of a magnetic stack sample.
Figure 11B:
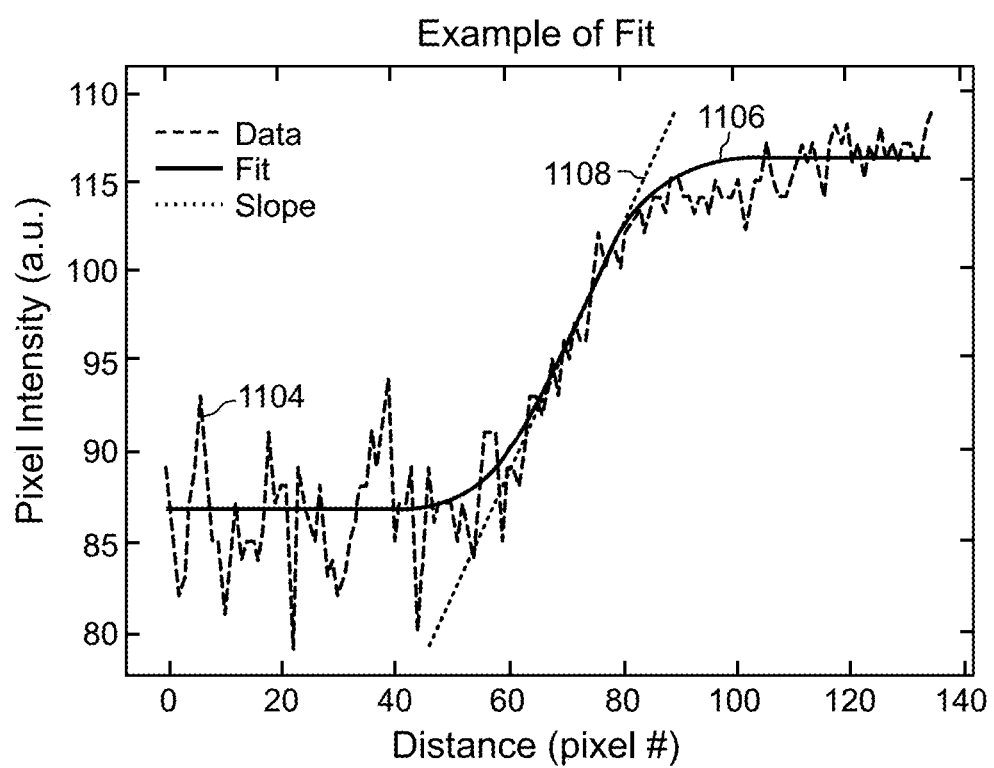
FIG. 11B is a plot of pixel intensity vs. distance along a line of pixels going from one magnetic domain to an adjacent magnetic domain in the image of FIG. 11A.

FIG. 11A is a MOKE microscopy image of a magnetic surface, and FIG. 11B is a plot of pixel intensity vs. distance used for quantifying the image resolution of the image of FIG. 11A, and more generally for determining the image resolution increase of the super-resolution MOKE microscopy methods and systems described herein. FIG. 11A is a digitally magnified and cropped version of the image of the magnetic CoPtGd stack sample shown in FIG. 10A. FIG. 11B is a plot of pixel intensity vs. distance (i.e., location, or pixel location) along a line of pixels going from one magnetic domain to an adjacent magnetic domain as illustrated by the line 1102 in FIG. 11A. The dotted curve 1104 of FIG. 11B represents the raw pixel intensity data, the solid curve 1106 represents a regression of the raw pixel intensity data, and the diagonal dotted line 1108 represents the approximate slope of the regression as the pixels transition from one magnetic domain to an adjacent magnetic domain in the image of FIG. 11A. The slope of the dotted line 1108 is representative of the resolution of the image of FIG. 11A, as the slope represents the number of pixels, or distance required for the image to transition from one magnetic domain to another magnetic domain. Higher resolution images exhibit higher slope values representing sharp image contrast between magnetic domains, while lower image resolutions exhibit lower slope values indicating a blurring of the image contrast between magnetic domains.

Figure 12:
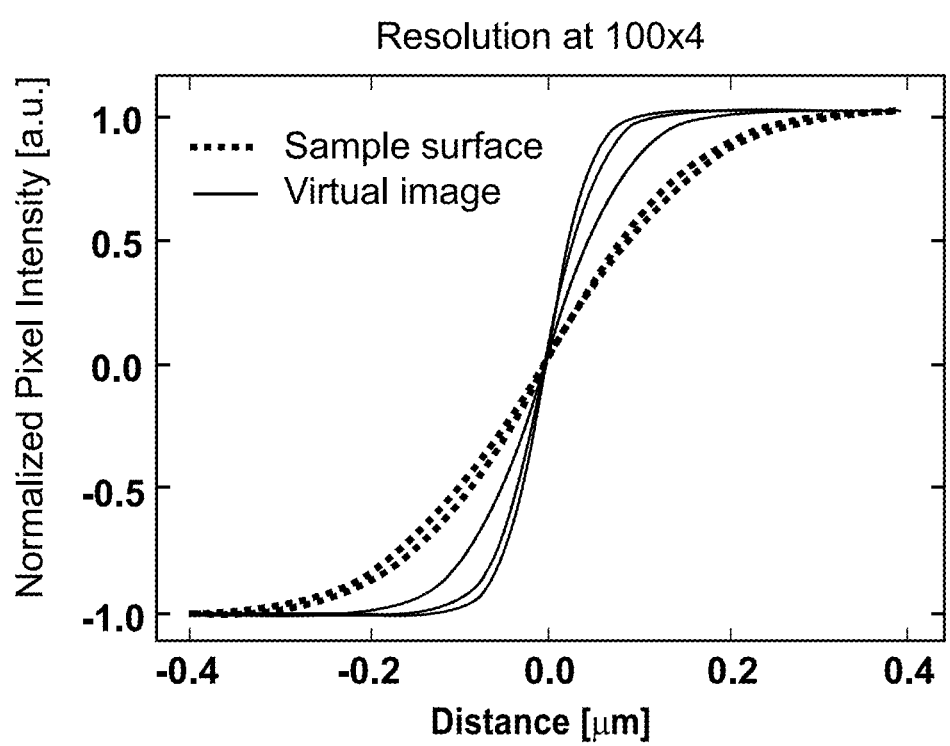
FIG. 12 is a plot of pixel intensity vs. distance characterizing the resolution of the images of FIG. 10A across multiple magnetic domain transitions.

FIG. 12 is a plot characterizing the resolution of the image of FIG. 10A and FIG. 10B across multiple magnetic domain walls. The lowest value on the y-axis (i.e., negative one) corresponds to a normalized maximally dark image pixel, and the highest value (i.e., positive one) corresponds to a maximally light image pixel. The dotted lines are regressions representing the normalized pixel intensity across a magnetic domain border in the image of FIG. 10A with the microscopy system being focused on the surface of the magnetic sample. The solid lines are regressions representing the normalized pixel intensity across a magnetic domain border in the image of FIG. 10B with the microscopy system being focused on a virtual image generated by a photonic nanojet. As previously described, the resolution of an image is related to the slope of the line representing the pixel intensity transition from one magnetic domain to another magnetic domain in an image. The slope of the dotted lines with the microscopy system focused on the surface of the sample is approximately 24.6±1.1. The slope of the solid lines representative of the resolution of the microscopy system focused on the virtual image is approximately 62.1±16. Therefore, the image resolution of the super-resolution MOKE microscopy image is nearly 2.5 times greater than a classical dispersion limited microscopy image. In embodiments, it is envisioned that the resolution can be improved by over 8 times the diffraction limited resolution by decreasing the diameter of microsphere microlenses to approximately 4 microns. Additionally, microsphere microlenses may have diameters of as small as 2 microns, which may enable MOKE microscopy imaging at resolutions of 20 to 30 nm, which is approximately 16 times the classical diffraction limit. In any embodiment, a smaller microsphere diameter allows for higher resolutions for a given material's index of refraction.

The following list of aspects reflects a variety of the embodiments explicitly contemplated by the present disclosure. Those of ordinary skill in the art will readily appreciate that the aspects below are neither limiting of the embodiments disclosed herein, nor exhaustive of all of the embodiments conceivable from the disclosure above, but are instead meant to be exemplary in nature.

1. A microlens imaging system for performing sub-diffraction limit optical imaging, the system comprising: a microlens layer comprising a plurality of microlenses disposed relative to a surface for imaging of the surface; an illumination source configured to provide optical radiation to the microlens layer, wherein the optical radiation has a wavelength such that the microlens layer focuses the optical radiation to form a photonic nanojet that is incident on the surface; and an imaging sensor configured to receive the optical radiation from the nanojet incident on the surface, and further configured to generate an electrical signal indicative of an image of the surface.

2. The microlens imaging system of aspect 1, wherein the microlens layer comprises a plurality of microspheres.

3. The microlens imaging system of either aspect 1 or aspect 2, wherein the microlens layer comprises a plurality of microlenses suspended in an immersive medium.

4. The microlens imaging system of aspect 3, wherein the immersive medium comprises an oil.

5. The microlens imaging system of aspect 3, wherein the immersive medium has an index of refraction of about 1.56, and wherein each of the plurality of microlenses have indices of refractions of about 1.95.

6. The microlens imaging system of aspect 3, wherein a refractive index of the immersive medium, a refractive index of at least one of the plurality of microlenses, and a geometry of at least one of the plurality of microlens are chosen to form a photonic nanojet.

7. The microlens imaging system of any of aspects 1 to 6, wherein the plurality of microlenses comprises barium titanate.

8. The microlens imaging system of any of aspects 1 to 7, further comprising: a first polarizer configured to polarize the optical radiation provided by the illumination source before the optical radiation is provided to the microlens layer; and a second polarizer configured to polarize the optical radiation received from the surface, or via transmission through the material, before the imaging sensor receives the optical radiation.

9. The microlens imaging system of aspect 8, wherein the first and second polarizers are a same polarizer.

10. The microlens imaging system of any of aspects 1 to 9, wherein a surface of at least one of the plurality of microlenses is positioned at a distance of less than 20 nanometers from the surface.

11. The microlens imaging system of any of aspects 1 to 10, wherein a surface of at least one of the plurality of microlenses is positioned at a distance of less than 200 nanometers from the surface.

12. The microlens imaging system of any of aspects 1 to 11, wherein a surface of at least one of the plurality of microlenses is in direct contact with the surface.

13. The microlens imaging system of any of aspects 1 to 12, further comprising: an imaging lens disposed between the surface and the imaging sensor configured to image a virtual image of the surface onto the imaging sensor; and a microlens layer holder configured to position the microlens layer at a distance from the imaging lens configured to provide the virtual image of the surface to the imaging lens.

14. The microlens imaging system of any of aspects 1 to 13, wherein the illumination source comprises a light emitting diode.

15. The microlens imaging system of any of aspects 1 to 14, wherein the wavelength of the optical radiation is between 350 and 800 nanometers.

16. The microlens imaging system of any of aspects 1 to 14, wherein the wavelength of the optical radiation is between 400 and 500 nanometers.

17. The microlens imaging system of any of aspects 1 to 14, wherein the optical radiation comprises black-body radiation.

18. The microlens imaging system of any of aspects 1 to 14, wherein the optical radiation comprises ultra-violet radiation.

19. The microlens imaging system of any of aspects 1 to 18, wherein the imaging sensor is configured to capture images at a frame rate of 2500 frames/second.

20. The microlens imaging system of any of aspects 1 to 19, wherein the imaging sensor is configured to capture images with a spatial resolution of 25 nm.

21. A method of fabricating a microlens imaging system for performing sub-diffraction limit optical imaging, the method comprising: positioning a microlens layer relative to a surface for imaging of the surface, wherein the microlens layer comprises a plurality of microlenses; providing, by an illumination source, optical radiation to the microlens layer, wherein the optical radiation has a wavelength such that the microlens layer focuses the optical radiation to form a photonic nanojet, and wherein the photonic nanojet is incident on the surface; receiving, by an imaging sensor, the optical radiation from the nanojet incident on the surface; and generating, by the imaging sensor, an electrical signal indicative of an image of the surface.

22. The method according to aspect 21, wherein the microlens layer comprises a plurality of microspheres.

23. The method according to either aspect 21 or aspect 22, wherein the microlens layer comprises a plurality of microlenses suspended in an immersive medium.

24. The method according to aspect 23, wherein the immersive medium comprises an oil.

25. The method according to aspect 23, wherein the immersive medium has an index of refraction of about 1.56, and wherein each of the plurality of microlenses have indices of refractions of about 1.95.

26. The method according to aspect 23, wherein a wavelength dependent refractive index of the immersive medium, a refractive index of at least one of the plurality of microlenses, and a geometry of at least one of the plurality of microlens are chosen to form a photonic nanojet.

27. The method according to any of aspects 21 to 26, wherein the plurality of microlenses comprises barium titanate.

28. The method according to any of aspects 21 to 27, further comprising: polarizing, by a first polarizer, the optical radiation provided by the illumination source before the optical radiation is provided to the microlens layer; and polarizing, by a second polarizer, the optical radiation received from the surface before the imaging sensor receives the optical radiation.

29. The method according to aspect 28, wherein the first and second polarizers are a same polarizer.

30. The method according to any of aspects 21 to 29, wherein a surface of at least one of the plurality of microlenses is positioned at a distance of less than 20 nanometers from the surface.

31. The method according to any of aspects 21 to 29, wherein a surface of at least one of the plurality of microlenses is positioned at a distance of less than 200 nanometers from the surface.

32. The method according to any of aspects 21 to 29, wherein a surface of at least one of the plurality of microlenses is in direct contact with the surface.

33. The method according to any of aspects 21 to 32, further comprising: an imaging lens disposed between the surface and the imaging sensor configured to image a virtual image of the surface onto the imaging sensor; and a microlens layer holder configured to position the microlens layer at a distance from the imaging lens configured to provide the virtual image of the surface to the imaging lens.

34. The method according to any of aspects 21 to 33, wherein the illumination source comprises a light emitting diode.

35. The method according to any of aspects 21 to 34, wherein the wavelength of the optical radiation is between 350 and 800 nanometers.

36. The method according to any of aspects 21 to 35, wherein the wavelength of the optical radiation is between 400 and 500 nanometers.

37. The method according to any of aspects 21 to 36, wherein the optical radiation comprises black-body radiation.

38. The method according to any of aspects 21 to 37, wherein the optical radiation comprises ultra-violet radiation.

39. The method according to any of aspects 21 to 38, wherein the imaging sensor is configured to capture images at frame rates of 2500 frames/second.

40. The method according to any of aspects 21 to 39, wherein the imaging sensor is configured to capture images with spatial resolution of resolution of 25 nm. about 1000 lines/mm.

What is claimed is:

1. A microlens imaging system for performing sub-diffraction limit optical imaging, the system comprising:
    a microlens layer comprising a plurality of microlenses disposed adjacent to a surface of a sample and configured to provide a photonic nanojet to the surface of the sample;
    an illumination source configured to provide optical radiation to the microlens layer, wherein the optical radiation has a wavelength such that the microlens layer focuses the optical radiation to form the photonic nanojet that is provided to, and is incident on, the surface of the sample;
    a first polarizer configured to polarize the optical radiation provided by the illumination source before the optical radiation is provided to the microlens layer;
    a second polarizer configured to polarize the optical radiation received from the surface of the sample before an imaging sensor receives the optical radiation; and
    the imaging sensor configured to receive the optical radiation from the photonic nanojet incident on the surface of the sample, and further configured to generate an electrical signal indicative of an image of a magnetic domain of the surface.

2. The microlens imaging system of claim 1, wherein the microlens layer comprises a plurality of microspheres.

3. The microlens imaging system of claim 1, wherein the plurality of microlenses comprises barium titanate.

4. The microlens imaging system of claim 1, wherein at least a surface of one of the plurality of microlenses is positioned at a distance of less than 20 nanometers from the surface of the sample.

5. The microlens imaging system of claim 1, wherein a surface of at least one of the plurality of microlenses is positioned at a distance of less than 200 nanometers from the surface of the sample.

6. The microlens imaging system of claim 1, wherein the imaging sensor is configured to capture images with a spatial resolution of about 25 nm.

7. The microlens imaging system of claim 1, wherein the microlens layer comprises a plurality of microlenses suspended in an immersive medium.

8. The microlens imaging system of claim 7, wherein the immersive medium has an index of refraction of about 1.56, and wherein each of the plurality of microlenses have indices of refractions of about 1.95.

9. The microlens imaging system of claim 7, wherein a refractive index of the immersive medium, a refractive index of at least one of the plurality of microlenses, and a geometry of at least one of the plurality of microlens are chosen to form a photonic nanojet.

10. A method of fabricating a microlens imaging system for performing sub-diffraction limit optical imaging, the method comprising:
    positioning a microlens layer adjacent to a surface of a sample and configured to provide a photonic nanojet to the surface of the sample, wherein the microlens layer comprises a plurality of microlenses;
    providing, by an illumination source, optical radiation to the microlens layer, wherein the optical radiation has a wavelength such that the microlens layer focuses the optical radiation to form a photonic nanojet, and wherein the photonic nanojet is incident on the surface of the sample;

polarizing, by a first polarizer, the optical radiation provided by the illumination source before the optical radiation is provided to the microlens layer;

polarizing, by a second polarizer, the optical radiation received from the surface of the sample;

receiving, by an imaging sensor, the optical radiation from the nanojet incident on the surface of the sample; and generating, by the imaging sensor, an electrical signal indicative of an image of a magnetic domain of the surface of the sample.

11. The method according to claim 10, wherein the microlens layer comprises a plurality of microspheres.

12. The method according to claim 10, wherein the plurality of microlenses comprises barium titanate.

13. The method according to claim 10, wherein a surface of at least one of the plurality of microlenses is positioned at a distance of less than 20 nanometers from the surface of the sample.

14. The method according to claim 10, wherein a surface of at least one of the plurality of microlenses is positioned at a distance of less than 200 nanometers from the surface of the sample.

15. The method according to claim 10, wherein the imaging sensor is configured to capture images with spatial resolution of about 25 nm.

16. The method according to claim 10, wherein the microlens layer comprises a plurality of microlenses suspended in an immersive medium.

17. The method according to claim 16, wherein the immersive medium has an index of refraction of about 1.56, and wherein each of the plurality of microlenses have indices of refractions of about 1.95.

18. The method according to claim 16, wherein a wavelength dependent refractive index of the immersive medium, a refractive index of at least one of the plurality of microlenses, and a geometry of at least one of the plurality of microlenses are chosen to form a photonic nanojet.

* * * * *